United States Patent
Min et al.

(10) Patent No.: US 9,244,145 B2
(45) Date of Patent: Jan. 26, 2016

(54) SYSTEM AND METHOD FOR MEASURING NEAR FIELD INFORMATION OF DEVICE UNDER TEST

(75) Inventors: Kyung Jin Min, Campbell, CA (US); Giorgi Muchaidze, Sunnyvale, CA (US); Besarion Chikhradze, Tbilisi, GA (US)

(73) Assignee: Amber Precision Instruments, Inc., San Jose, CA (US)

( * ) Notice: Subject to any disclaimer, the term of this patent is extended or adjusted under 35 U.S.C. 154(b) by 447 days.

(21) Appl. No.: 13/540,604

(22) Filed: Jul. 2, 2012

(65) Prior Publication Data
US 2013/0002275 A1    Jan. 3, 2013

Related U.S. Application Data

(60) Provisional application No. 61/503,582, filed on Jun. 30, 2011.

(51) Int. Cl.
| | | |
|---|---|---|
| *G01R 31/00* | (2006.01) | |
| *G01R 35/00* | (2006.01) | |
| *G01R 31/319* | (2006.01) | |
| *G01R 29/08* | (2006.01) | |

(52) U.S. Cl.
CPC .......... *G01R 35/005* (2013.01); *G01R 31/3191* (2013.01); *G01R 29/0871* (2013.01)

(58) Field of Classification Search
CPC ............... G01R 31/002; G01R 31/001; G01R 31/3191; G01R 31/2886; G01R 29/0878; G01R 29/0871; G01R 1/06705; G01R 35/005; G01R 35/00; G06Q 60/22

USPC ........... 324/750.02, 227, 242, 243, 247, 522, 324/523

See application file for complete search history.

(56) References Cited

U.S. PATENT DOCUMENTS

| | | | | | |
|---|---|---|---|---|---|
| 5,557,206 A | * | 9/1996 | Won | ........................ | G01V 3/107 324/262 |
| 6,636,173 B2 | * | 10/2003 | Graham | .................. | G01R 29/10 342/174 |
| 6,734,425 B2 | * | 5/2004 | Hantschel | .............. | B82Y 35/00 250/307 |

(Continued)

FOREIGN PATENT DOCUMENTS

| | | | | | |
|---|---|---|---|---|---|
| DE | 202007010784 U | * | 10/2007 | ........... | G01R 31/302 |
| DE | 202007010784 U | * | 11/2007 | | |

(Continued)

OTHER PUBLICATIONS

Weng et al., Estimation of Current From Near-Field Measurement, 2005, IEEE, pp. 1-6.*

(Continued)

*Primary Examiner* — Patrick Assouad
*Assistant Examiner* — Sean Curtis

(57) ABSTRACT

A system and method for measuring near field information of a device under test (DUT) uses a reference probe and a measurement probe that are configured to sense a field. A probe calibration factor is used to determine corresponding field values for signals from the measurement probe at sampling locations about the DUT. The probe calibration factor is derived from measured signals about a conductive trace using a probe and simulated field information for the conductive trace when subjected to a simulated reference signal.

16 Claims, 3 Drawing Sheets

(56) References Cited

U.S. PATENT DOCUMENTS

| | | | | |
|---|---|---|---|---|
| 7,106,057 B2 * | 9/2006 | Matthews | B82Y 35/00 324/248 |
| 7,285,963 B2 * | 10/2007 | Talanov | B82Y 20/00 324/601 |
| 7,609,077 B2 * | 10/2009 | Campbell | G01R 1/06772 324/755.11 |
| 7,764,072 B2 * | 7/2010 | Strid | G01R 1/06772 324/149 |
| 7,876,114 B2 * | 1/2011 | Campbell | G01R 1/06772 324/754.06 |
| 8,220,066 B2 * | 7/2012 | Humphris | B82Y 35/00 356/487 |
| 8,803,538 B2 * | 8/2014 | Zelder | G01R 27/32 324/754.01 |
| 8,847,617 B2 * | 9/2014 | Nickel | G01R 31/3025 324/754.21 |
| 2002/0033706 A1 * | 3/2002 | Khazei | G01R 29/0821 324/750.22 |
| 2002/0039030 A1 * | 4/2002 | Khazei | G01R 31/002 324/754.29 |
| 2002/0040466 A1 * | 4/2002 | Khazei | G06F 17/5036 716/115 |
| 2002/0095304 A1 * | 7/2002 | Khazei | G01R 31/002 702/127 |
| 2003/0117315 A1 * | 6/2003 | Graham | G01R 29/10 342/174 |
| 2003/0183761 A1 * | 10/2003 | Hantschel | B82Y 35/00 250/306 |
| 2007/0285322 A1 * | 12/2007 | Nyshadham | G01R 29/0878 343/703 |
| 2009/0140946 A1 * | 6/2009 | Ziolkowski | H01Q 7/00 343/788 |
| 2010/0007568 A1 * | 1/2010 | Fear | H01P 5/10 343/772 |
| 2010/0141241 A1 * | 6/2010 | Dijkstra | G01R 29/0878 324/149 |
| 2010/0235955 A1 * | 9/2010 | Humphris | B82Y 35/00 850/6 |
| 2011/0193566 A1 * | 8/2011 | Nyshadham | G01R 29/0878 324/637 |
| 2011/0260743 A1 * | 10/2011 | Zelder | G01R 27/32 324/754.03 |
| 2012/0126828 A1 * | 5/2012 | Cohen | A61B 5/053 324/629 |
| 2012/0268153 A1 * | 10/2012 | Nickel | G01R 31/3025 324/754.31 |
| 2012/0306521 A1 * | 12/2012 | Nickel | G01R 31/3025 324/754.03 |
| 2013/0187674 A1 * | 7/2013 | Rada | G01R 35/005 324/750.02 |

FOREIGN PATENT DOCUMENTS

| | | | | |
|---|---|---|---|---|
| DE | 102009035421 A1 * | 2/2011 | G01R 29/0892 |
| WO | WO 02/12907 | * | 2/2002 | G01R 29/08 |
| WO | WO 2009/018928 | * | 12/2009 | G01R 31/304 |

OTHER PUBLICATIONS

Newell et al., Higher Order Mode Probes in Spherical Near-Field Measurements, 2013, IEEE, pp. 1-5.*

* cited by examiner

SYSTEM AND METHOD FOR MEASURING NEAR FIELD INFORMATION OF DEVICE UNDER TEST

CROSS REFERENCE TO RELATED APPLICATION

This application is entitled to the benefit of U.S. Provisional Patent Application Ser. No. 61/503,582, filed on Jun. 30, 2011, which is incorporated herein by reference.

BACKGROUND OF THE INVENTION

Electronic components of devices can be sources of electric and magnetic fields, which manifest as near field energies and far field energies. Near field energies, which are easier to measure than far field energies, can be used to design and test electrical and electronic devices so that performance requirements for the devices are satisfied, e.g., the performance of the devices conforms to established standards, such as IEEE C63.4.

Near field measurements can be used for various post processing operations, such as near field to far field transformation, the creation of Huygens surfaced models for intra-system coupling study and the reconstruction of electromagnetic sources.

In order to perform these post processing operations, very accurate near electric and near magnetic fields need to be measured. In principle, it is sufficient to measure only the near electric field or the near magnetic field. However, the post processing operations based on such measurements would become very sensitive to small measurement errors, such as, position errors, effects of probes on the fields, and magnitude errors. Thus, post processing operations based on conventional near field measurements may not be as accurate as desired.

In view of the above challenges, there is a need for a system and method for measuring near field energies of a device under test (DUT), and to more accurately perform post processing operations based on the near field measurements.

SUMMARY OF THE INVENTION

A system and method for measuring near field information of a device under test (DUT) uses a reference probe and a measurement probe that are configured to sense a field. A probe calibration factor is used to determine corresponding field values for signals from the measurement probe at sampling locations about the DUT. The probe calibration factor is derived from measured signals about a conductive trace using a probe and simulated field information for the conductive trace when subjected to a simulated reference signal.

A system in accordance with an embodiment of the invention comprises a reference probe and a measurement probe that are configured to sense a field about a DUT, an analysis device coupled to the reference and measurement probes to capture signals from the reference and measurement probes, a computer system operably coupled to the analysis device to determine corresponding field values for the signals from the measurement probe using a probe calibration factor, and a signal generator configured to transmit a reference signal onto a conductive trace to produce a field, wherein the measurement probe is used to measure signals about the conductive trace to derive the probe calibration from the measured signals and simulated field information for the conductive trace when subjected to a simulated reference signal.

A method in accordance with an embodiment of the invention comprises executing a simulation for a conductive trace to obtain simulated field information for the conductive trace when subjected to a simulated reference signal, transmitting an actual reference signal onto the conductive trace, measuring voltage at the conductive trace due to the actual reference signal, determining field values using the measured voltage and the simulated field information, acquiring signals from multiple sampling locations about the conductive trace using a measurement probe, and determining a probe calibration factor using the acquired signals and the field values, the probe calibration factor being used during a measurement process to determine field values for signals measured about the DUT using the measurement probe.

Other aspects and advantages of the present invention will become apparent from the following detailed description, taken in conjunction with the accompanying drawings, illustrated by way of example of the principles of the invention.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

Figure 1:
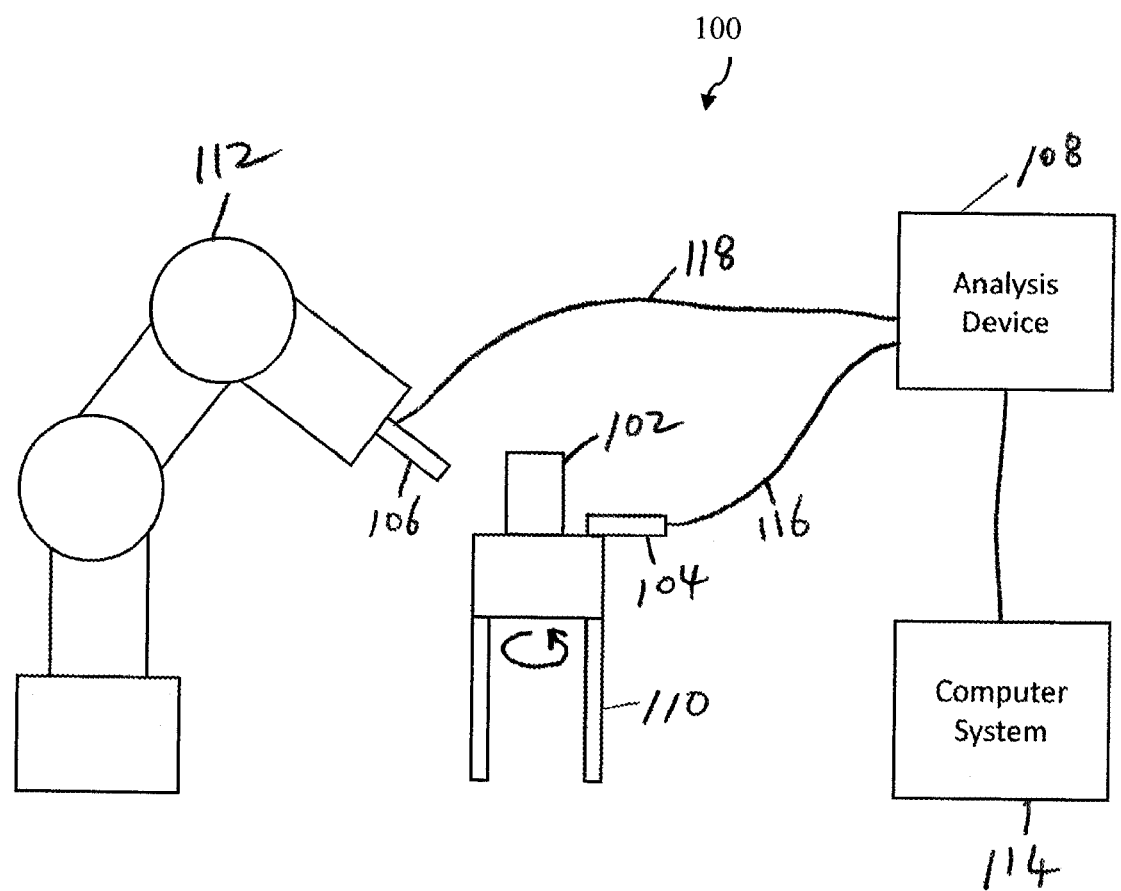
FIG. 1 is a diagram of a measuring system in accordance with an embodiment of the invention.

Turning now to FIG. 1, a measuring system 100 for measuring near electric and/or magnetic fields produced by a device under test (DUT) 102 in accordance with an embodiment of the invention is illustrated. As described in more detail below, the system can be used to measure not only amplitude, but also phase, of near fields from the DUT, which can be an integrated circuit (IC), a printed circuit board (PCB) or any electronic device, module or system. As an example, the DUT may be a cell phone. The near field phase measurements can be used for various post processing operations, such as near field to far field transformation, the creation of Huygens surfaced models for intra-system coupling study and the reconstruction of electromagnetic sources.

As shown in FIG. 1, the system 100 includes a reference probe 104 and a measurement probe 106, an analysis device 108, a DUT support structure 110, a probe positioning mechanism 112 and a computer system 114. The reference and measurement probes are used to detect near electric and/or magnetic fields from the DUT 102. If the reference and measurement probes are used to detect near electric fields, then E-field probes are used as the reference and measurement probes. If the reference and measurement probes are used to detect near magnetic fields, then H-field probes are used as the reference and measurement probes. In an embodiment, the system includes two E-field probes and two H-field probes so that both electric and magnetic fields can be measured. In this embodiment, near electric field measurements are made using the E-field probes as the reference and measurement probes, and then near magnetic field measurements are made using the H-field probes as the reference and measurement probes or vice versa. In operation, the reference probe is fixed at a stationary location with respect to the DUT, while the measurement probe is moved to various sampling locations about the DUT, as described in more detail below with respect to the DUT support structure and the probe positioning mechanism.

The reference and measurement probes 104 and 106 are connected to the analysis device 108 using cables 116 and 118. In particular, the cable 116 connected to the reference probe is inserted into an input channel of the analysis device, and the cable 118 connected to the measurement probe is inserted into another input channel of the analysis device. In some embodiments, one or more amplifiers (not shown) may be connected to the cables between the reference and measurement probes and the analysis device to amplify the signals from the probes. The analysis device can be any device that can measure and process signals from the reference and measurement probes due to electric and/or magnetic fields at the same time in time domain. Thus, the analysis device generates time domain measurements for electric and magnetic fields using the reference and measurement probes. In an embodiment, the analysis device is an oscilloscope, which typically has four or more input channels.

The analysis device 108 is connected to the computer system 114, which receives and processes the time domain signals generated by the analysis device. The computer system is configured or programmed to convert the data captured by the analysis device in time domain into frequency domain. In an embodiment, the computer system is configured or programmed to use Fast Fourier transform for the conversion of the captured data from time domain into frequency domain. After the conversion, the magnitude of the measured field at each sampling location can be derived from the signals captured by the measurement probe using a probe calibration factor, which is described below. The phase of the measured field at each sampling location can also be derived from the phase difference between the signal from the reference probe and the signal from the measurement probe at the same frequency for that sampling location using a phase calibration factor, which is also described below. The derived magnitudes and phases can then be used for various post processing operations, which may be performed by the computer system. In other embodiments, the analysis device may be configured to convert the time domain signals into frequency domain signals so that the computer system receives and processes the frequency domain signals.

The DUT support structure 110 is configured to support the DUT 102 during a measuring operation and to allow the measurement probe 106 to access different sampling locations about the DUT. In the illustrated embodiment, the DUT support structure is configured to hold the DUT and rotate the DUT so that the measurement probe can access various sampling locations about the DUT. However, in other embodiments, the DUT support structure may have different configurations as needed, which may partly be dependent on the DUT.

The probe positioning mechanism 112 is configured to move the measurement probe 106, which is attached or held by the probe positioning mechanism, to various sampling locations about the DUT 102. In the illustrated embodiment, the probe positioning mechanism is a six-axis robotic arm. However, in other embodiments, the probe positioning mechanism can be any type of robotic arm or mechanism that can move the measurement probe to desired locations on or near the DUT.

For the system 100 to properly measure the phase of fields from the DUT 102, the measurement probe's ratio of the output signal, e.g., voltage, of the measurement probe 106 at a sampling location to the field at that sampling location without the presence of the probe needs to be known. This ratio is a complex number, and thus, it contains the magnitude and the phase. The components of the system, including the cables 116 and 118 and any amplifiers attached to the probes, affect the phase and magnitude, and thus, any post processing operations, such as near field to far field transformation. While it is in principle possible to calibrate the probes, the cables and any amplifiers of the system individually, and then chain their effects by using, for example, S-parameters, the resulting measurements may not be sufficiently accurate since reflections and other changes can affect the accuracy of the results. A solution in accordance with an embodiment of the invention is to calibrate the probes, the cables and any other components of the system for magnetic and/or electric fields prior to the measurement on the DUT using the same components.

Figure 2:
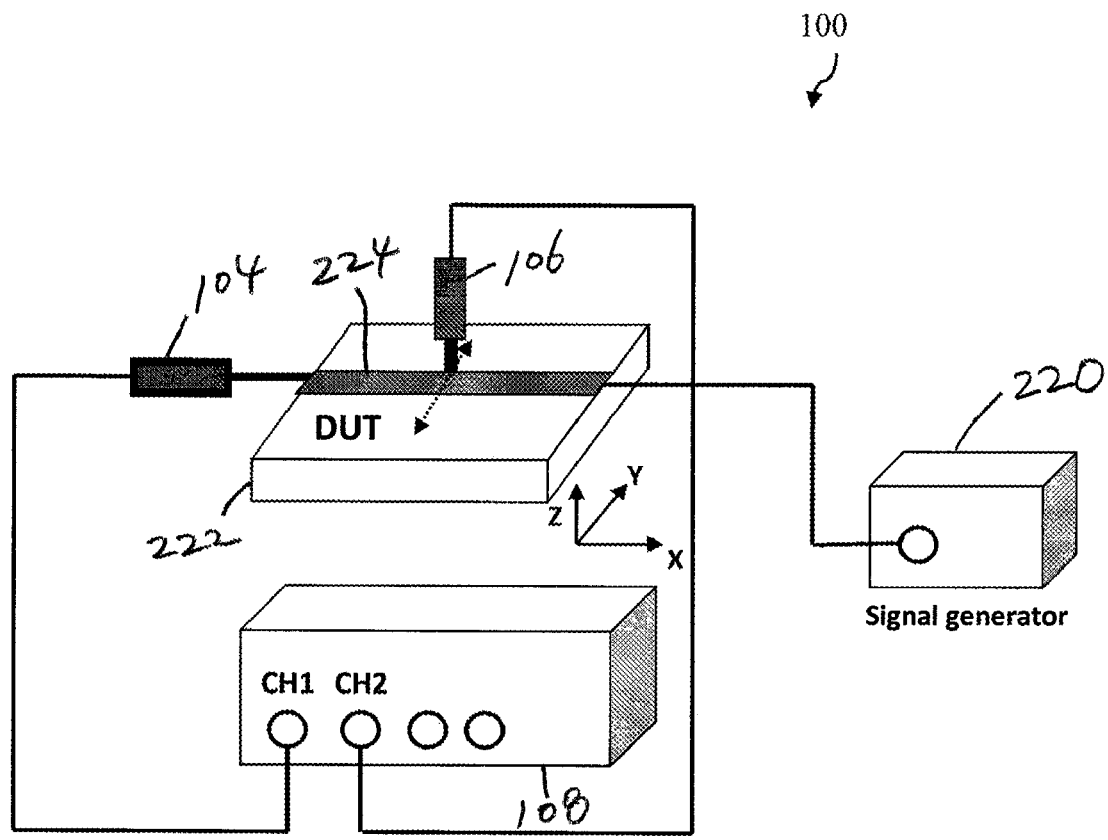
FIG. 2 is a block diagram of the measuring system for performing a calibration process in accordance with an embodiment of the invention.

In order to calibrate the system 100, the system further includes a signal generator 220 and a calibration device 222 with at least one conductive trace 224, as illustrated in FIG. 2. In FIG. 2, the DUT support structure 110, probe positioning mechanism 112 and the computer system 114 are not shown. The signal generator and the calibration device are used to derive a probe calibration factor for the measurement probe 106 from the ratio of the simulated field above the trace and the measured signal, e.g., voltage, at the analysis device 108. The signal generator is configured to generate signals in the frequency range of interest, which are applied to the conductive trace of the calibration device to create a reference field, e.g., a transverse electromagnetic (TEM) field, which can be easily simulated. For a micro-strip, the field of the micro-strip can be simulated very well because the micro-strip can be viewed as a very similar coaxial cable (co-ax) that is subjected to a simple reference signal. The result of the simulation is the ratio between the signal, e.g., voltage, on the micro-strip and the field about the micro-strip at each location near the micro-strip. The simulation, however, does NOT simulate the field above the micro-strip. This can be obtained by measuring the voltage at the end of the micro-strip, and then applying the appropriate ratio obtained from the simulation.

The signal generator 220 may be any signal generator, such as a sine wave generator or a comb generator, which is configured to produce multiple harmonics of its input signal. However, the use of a comb generator allows the simultaneous measurement of many frequencies using only one wave form capture per sampling location and probe, which facilitates a faster measurement speed than using a sine wave generator and an oscilloscope. In an embodiment, the calibration device 222 has a single conductive strip 224, which may be a 50 Ohm conductive strip, for example.

A calibration process in accordance with an embodiment of the invention is now described. In this calibration process, only one probe is used for the calibration. The probe that is used will be subsequently used as the measurement probe 106 during a measuring process. In this description, the conductive trace 224 of the calibration device will be referred to as a micro-strip. However, the calibration device can have any type of a conductive trace.

First, the ratio of field above the micro-strip 224 of the calibration device 222 to voltage on the micro-strip at each location about the micro-strip is pre-simulated, using a simulation tool, such as Microwave (MW) Studio from CST or NFSS from ANSYS, Inc. This ratio is simulated field information for the micro-strip when the micro-strip is subjected to a simulated reference signal. The simulation tool may be running on the computer system 114 or any other computer system. In an embodiment, this ratio in the form of an absolute value is obtained for every 0.25 mm from 0.25 mm from the micro-strip to 20 mm from the micro-strip in all directions.

Next, the system 100 is setup for calibration. The calibration device 222 is positioned on the DUT support structure 110. Then, one end of the micro-strip 224 of the calibration device is connected to the signal generator 220 and the other end of the micro-strip is connected to an input channel of the analysis device 108, e.g., an oscilloscope. After the setup is complete, the signal generator is used to transmit an actual reference signal through the micro-strip, e.g., a 1 volt Gaussian pulse, and the signal, e.g., voltage, at the micro-strip is measured using the analysis device.

Next, the theoretical field above the micro-strip is determined by using the measured voltage at the micro-strip 224 and the ratios derived from the simulation. That is, since the simulation provides the ratio of field above the micro-strip to voltage on the micro-strip at a particular location, the expected field above the micro-strip at that particular location for the measured voltage can be determined using the measured voltage and the ratio from the simulation for that particular location.

After determining the expected field above the micro-strip at the various locations about the micro-strip, the measurement probe 106 is positioned above the micro-strip 224 and moved along a predefined direction or path to acquire signals at more than one sampling location along this path. In an embodiment, the probe is positioned at a fixed height from the center of the micro-strip and is moved in a direction perpendicular to the length of the micro-strip for a fixed distance, e.g., from 20 mm to the left of the center of the micro-strip to 20 mm to the right of the center of the micro-strip, at a fixed height. The signals, e.g., voltages, at the output of the probe are then measured using the analysis device 108 and converted from time domain to frequency domain by the computer system 114 or the analysis device. At each frequency, the measured signals are compared with that of the expected field, i.e., the theoretical values, to find a correction factor or a probe calibration factor as a ratio of the magnitude between the simulated field and the measured signal from the probe at a particular sampling location. The probe calibration factor may be a complex number. In an embodiment, the maximum or minimum values of the measured signals are compared with the corresponding maximum or minimum values of the expected field to correctly match the measured signals with the expected field values. As an example, the maximum values may be used when calibrating for electric field, while the minimum values may be used when calibrating for magnetic field. The probe calibration factor is used during a measurement operation to convert a signal from the measurement probe at a sampling location into a field value for that sampling location.

In addition, a ratio between the phase derived from the simulated field, i.e., the theoretical values, and the phase derived from the measured signals is determined. That is, the phase difference between the phase derived from the simulated field, i.e., the theoretical values, and the phase derived from the measured signals is determined. This phase difference may be expressed in angles. This phase difference is the phase calibration factor that is used during a measuring process to derive the phase of the measured electric and/or magnetic fields.

The above calibration process is performed for each of the electric and magnetic fields using the corresponding type of probes. As an example, H-field probes may first be used in the system 100 to obtain a magnetic-field probe calibration factor and a magnetic-field phase calibration factor for each probe location. Then, the H-field probes may be replaced with E-field probes in the system to obtain an electric-field probe calibration factor and an electric-field phase calibration factor for each probe location A calibration process in accordance with an alternative embodiment of the invention is now described. In this calibration process, two probes are used for the calibration. As is the case during a measurement process, a reference probe and a measurement probe are used during this calibration process. This two-probe calibration process is similar to the one-probe calibration process described above. After a signal from the signal generator 220 is applied to the micro-strip 224 and the voltage at the micro-strip is measured, the measurement probe is again used to obtain signals at desired locations along a predefined path. However, in this calibration process, the reference probe is used to obtain a phase calibration factor by the ratio of phases between the signals from the reference probe and the signals from the measurement probe. If this procedure is followed, then one will have a probe factor that correctly determines the field at the measurement probe position (how strong the field was before the probe moved to the position) and the phase between the reference probe position and the measurement probe position.

Figure 3:
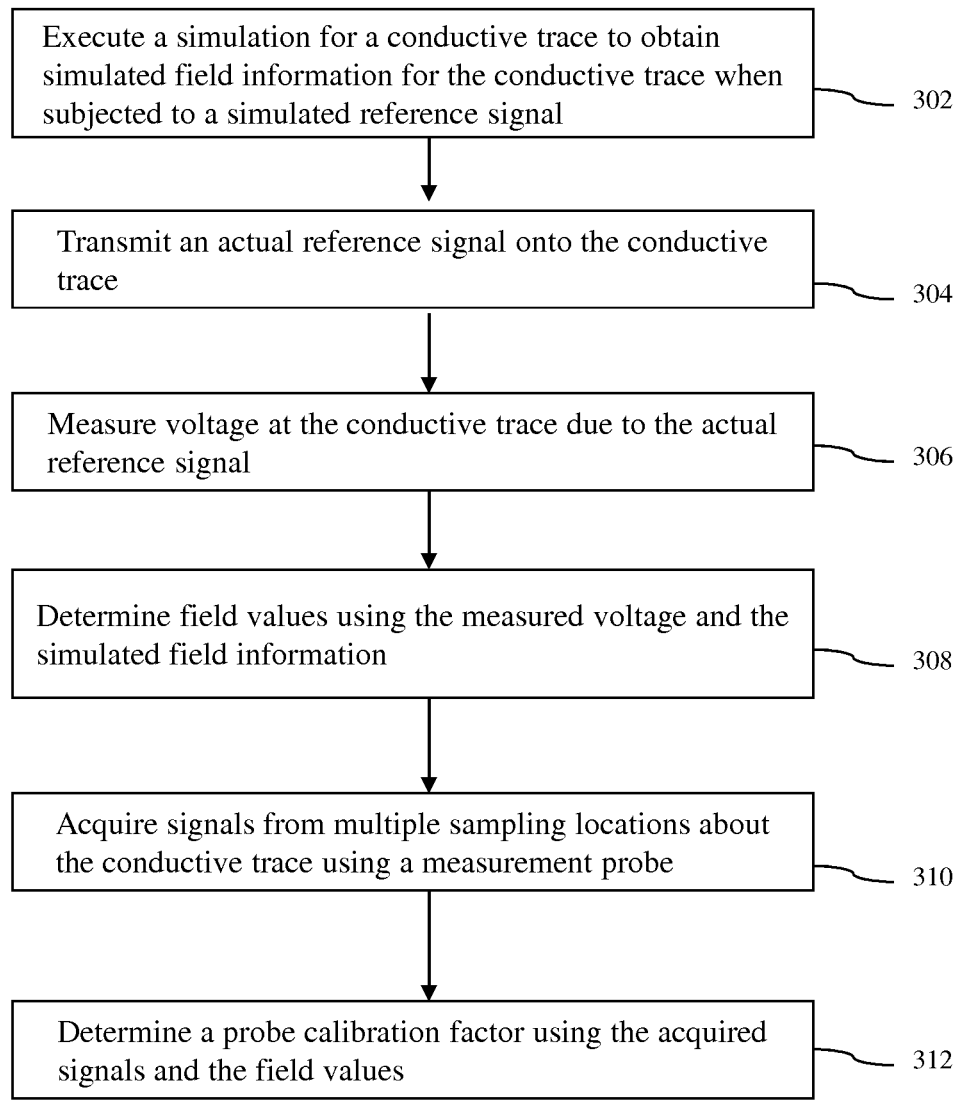
FIG. 3 is a flow diagram of a method for measuring near field phase information of a device under test (DUT) in accordance with an embodiment of the invention.

A method for measuring near field information of a DUT in accordance with an embodiment of the invention is described with reference to a flow diagram of FIG. 3. At block 302, a simulation for a conductive trace is executed to obtain simulated field information for the conductive trace when subjected to a simulated reference signal. Next, at block 304, an actual reference signal is transmitted onto the conductive trace. Next, at block 306, voltage at the conductive trace due to the actual reference signal is measured. Next, at block 308, field values are determined using the measured voltage and the simulated field information. Next, at block 310, signals from multiple sampling locations about the conductive trace are acquired using a measurement probe. Next, at block 312, a probe calibration factor is determined using the acquired signals and the field values. The probe calibration factor is used during a measurement process to determine field values for signals measured about the DUT using the measurement probe.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods may be implemented using software instructions stored on a computer useable storage medium for execution by a computer. As an example, an embodiment of a computer program product includes a computer useable storage medium to store a computer readable program that, when executed on a computer, causes the computer to perform operations, as described herein.

Furthermore, embodiments of at least portions of the invention can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

The computer-useable or computer-readable medium can be an electronic, magnetic, optical, electromagnetic, infrared, or semiconductor system (or apparatus or device), or a propagation medium. Examples of a computer-readable medium include a semiconductor or solid state memory, magnetic tape, a removable computer diskette, a random access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A system for measuring near field information of a device under test (DUT), the system comprising:
   a reference probe and a measurement probe that are configured to sense a field about the DUT;
   an analysis device coupled to the reference and measurement probes to capture signals from the reference and measurement probes;
   a computer system operably coupled to the analysis device to determine corresponding field values for the signals from the measurement probe using a probe calibration factor; and
   a signal generator configured to transmit a reference signal onto a conductive trace to produce a field, the conductive trace being connected to the analysis device to measure voltage at the conductive trace when the reference signal is transmitted onto the conductive trace,
   wherein the measurement probe is used to measure signals about the conductive trace to derive the probe calibration from the measured signals and simulated field information for the conductive trace when subjected to a simulated reference signal, and
   wherein the simulated field information includes a ratio of field above the conductive trace to voltage on the conductive trace when the conductive trace is subjected to the simulated reference signal.

2. A method for measuring near field information of a device under test (DUT), the method comprising:
   executing a simulation for a conductive trace to obtain simulated field information for the conductive trace when subjected to a simulated reference signal;
   transmitting an actual reference signal onto the conductive trace using a signal generator;
   measuring voltage at the conductive trace due to the actual reference signal at an analysis device;
   determining field values using the measured voltage and the simulated field information;
   acquiring signals from multiple sampling locations about the conductive trace using a measurement probe;
   determining a probe calibration factor using the acquired signals and the field values, the probe calibration factor being used during a measurement process to determine field values for signals measured about the DUT using the measurement probe;
   sensing a field about the DUT using a reference probe and the measurement probe;
   capturing signals from the reference and measurement probes at the analysis device; and
   determining corresponding field values for the signals from the measurement probe using the probe calibration factor,
   wherein the simulated field information includes a ratio of field above the conductive trace to voltage on the conductive trace when the conductive trace is subjected to the simulated reference signal.

3. The system of claim 1, wherein each of the reference and measurement probes is configured to measure at least one of electric and magnetic field.

4. The system of claim 1, wherein the DUT includes an integrated circuit or a printed circuit board.

5. The system of claim 1, further comprising a probe positioning mechanism on which the measurement probe is attached, the probe positioning mechanism being configured to move the measurement probe.

6. The system of claim 5, wherein the probe positioning mechanism includes a robotic arm.

7. The system of claim 1, wherein the signal generator includes at least one of a sine wave generator or a comb generator.

8. The system of claim 1, wherein the analysis device includes an oscilloscope.

9. The system of claim 1, wherein the conductive trace is a 50 Ohm conductive strip.

10. The method of claim 2, wherein each of the reference and measurement probes is configured to measure at least one of electric and magnetic field.

11. The method of claim 2, wherein the DUT includes an integrated circuit or a printed circuit board.

12. The method of claim 2, further comprising moving the measurement probe to different sampling locations about the DUT using a probe positioning mechanism.

13. The method of claim 12, wherein the probe positioning mechanism includes a robotic arm.

14. The method of claim 2, wherein the signal generator includes at least one of a sine wave generator or a comb generator.

15. The method of claim 2, wherein the analysis device includes an oscilloscope.

16. The method of claim 2, wherein the conductive trace is a 50 Ohm conductive strip.

* * * * *